(12) United States Patent
Walker et al.

(10) Patent No.: US 6,534,863 B2
(45) Date of Patent: Mar. 18, 2003

(54) COMMON BALL-LIMITING METALLURGY FOR I/O SITES

(75) Inventors: George F. Walker, New York, NY (US); Ronald D. Goldblatt, Yorktown Heights, NY (US); Peter A. Gruber, Mohegan Lake, NY (US); Raymond R. Horton, Dover Plains, NY (US); Kevin S. Petrarca, Newburgh, NY (US); Richard P. Volant, New Fairfield, CT (US); Tien-Jen Cheng, Bedford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/781,121

(22) Filed: Feb. 9, 2001

(65) Prior Publication Data
US 2002/0111010 A1 Aug. 15, 2002

(51) Int. Cl.$^7$ .............................................. H01L 23/48
(52) U.S. Cl. ........................ 257/737; 257/751; 257/761; 257/762; 257/766; 257/769; 257/781; 257/784
(58) Field of Search ................................. 257/735–738, 257/751, 758, 761, 762, 766, 769, 780, 781, 784; 438/612–617

(56) References Cited

U.S. PATENT DOCUMENTS

| | | | |
|---|---|---|---|
| 4,985,310 A | 1/1991 | Agarwala et al. | 428/620 |
| 5,071,359 A | 12/1991 | Arnio et al. | 439/91 |
| 5,244,833 A | 9/1993 | Gansauge et al. | 216/13 |
| 5,294,486 A | 3/1994 | Paunovic et al. | 428/672 |
| 5,356,526 A | 10/1994 | Frankenthal et al. | 205/122 |
| 5,361,971 A | 11/1994 | Williams et al. | 228/193 |
| 5,434,452 A | 7/1995 | Higgins, III | 257/773 |
| 5,442,239 A | 8/1995 | Digiacomo et al. | 257/781 |
| 5,457,345 A | 10/1995 | Cook et al. | 257/766 |
| 5,872,400 A | 2/1999 | Chapman et al. | 257/738 |

(List continued on next page.)

FOREIGN PATENT DOCUMENTS

| | | |
|---|---|---|
| JP | 9321050 A2 | 12/1997 |
| JP | 10-163590 | 6/1998 |

OTHER PUBLICATIONS

Tran, T. et al.: Fine Pitch Probing and Wire Bonding and Reliability of Aluminum Cap Copper Bond Pads. (Presentation) 2000 Southwest Test Workshop [Online] San Diego, CA, Jun. 11–14, 2000: IEEE [Retrieved on Jan. 8, 2001]. Retrieved From The Internet: <URL:http://www.swtest.org/2000proc/PDF/S22_Tran.pdf>.

(List continued on next page.)

*Primary Examiner*—Ha Tran Nguyen
(74) *Attorney, Agent, or Firm*—Todd M. C. Li

(57) ABSTRACT

A process is described for forming a common input-output (I/O) site that is suitable for both wire-bond and solder bump flip chip connections, such as controlled-collapse chip connections (C4). The present invention is particularly suited to semiconductor chips that use copper as the interconnection material, in which the soft dielectrics used in manufacturing such chips are susceptible to damage due to bonding forces. The present invention reduces the risk of damage by providing site having a noble metal on the top surface of the pad, while providing a diffusion barrier to maintain the high conductivity of the metal interconnects. Process steps for forming an I/O site within a substrate are reduced by providing a method for selectively depositing metal layers in a feature formed in the substrate. Since the I/O sites of the present invention may be used for either wire-bond or solder bump connections, this provides increased flexibility for chip interconnection options, while also reducing process costs.

17 Claims, 6 Drawing Sheets

U.S. PATENT DOCUMENTS

| | | | |
|---|---|---|---|
| 5,907,790 A | 5/1999 | Kellam | 438/666 |
| 5,915,977 A | 6/1999 | Hembree et al. | 439/74 |
| 5,960,251 A | 9/1999 | Brusic et al. | 428/551 |
| 6,165,888 A | 12/2000 | Kwon et al. | 438/617 |
| 6,218,302 B1 * | 4/2001 | Braeckelmann et al. | 438/687 |

OTHER PUBLICATIONS

Serial app. #09/567,466, filed May 9, 2000, Docket # FIS9–2000–0016,Encapsulated metal structures for semiconductor devices and MIM capacitors including the same.

Serial app. #09/567,468, filed May 9, 2000, Docket # FIS9–1999–0155, Selective plating process.

Serial app. #09/567,469, filed May 9, 2000, Docket # FIS9–2000–0015, Replated metal structures for semiconductor devices.

Serial app. #09/605,728, filed Jun. 28, 2000, Docket # FIS9–2000–0064, Reinforced integrated circuits.

U.S. application No. 09/567,467, Entitled "Adhesion Promoter and Diffusion Barrier For Electroless Plating in Semiconductor Devices", Filed May 9, 2000, Status—Pending.

"Copper barrier, seed layer and planarization technologies"—VMIC Conference, Jun. 10–12, 1997, Ding et al., pp. 87–92 1997 ISMIC—107/97/0087(c).

* cited by examiner

COMMON BALL-LIMITING METALLURGY FOR I/O SITES

FIELD OF THE INVENTION

The present invention relates to semiconductor processing, and more particularly to a process for fabricating a common ball-limiting metallurgy for input/output (I/O) sites used in packaging integrated circuit (IC) chips.

BACKGROUND OF TEE INVENTION

In the fabrication of semiconductor devices, metal lines are often embedded in dielectric layers in a multilevel structure, particularly in the latter stage ("back end of the line" or "BEOL") of the fabrication process. The final layer containing metal lines (sometimes referred to in the art as the terminal via or TV layer) will have metal pads fabricated in contact with the metal lines, in a process sometimes referred to as "far back end of the line", or "far BEOL". The pads and lines together provide interconnects from the chip to other system components. The majority of IC chips use aluminum (Al) to form the interconnects, but more recently copper (Cu) is used.

Some advantages of using Cu rather than Al to form interconnects include higher conductivity (with lower resistance), lower capacitive load, lower power consumption, less crosstalk, fewer metal layers and fewer potential manufacturing steps. However, the disadvantages of using Cu include increased difficulty of depositing thin layers of Cu, potential for contamination of the Cu by underlying silicon thereby lowering performance, migration of Cu between lines, thereby increasing the risk of electrical shorts, and a mismatch in thermal expansion between the substrate and the Cu pads and lines. In order to take full advantage of Cu interconnects, methods of forming Cu interconnects must attempt to overcome these disadvantages of using copper.

Depending on the application, a variety of techniques are used to provide connections between a chip and other components, such as another level of interconnect. Common connections include wire bond and solder bumps.

Wire bonding is well-known in the art and used in the majority of IC chips, but disadvantages include a limited density of interconnect sites and, particularly during chip functional testing, there is the possibility of mechanical damage to the chip at the site of the bond. A typical example of a wire bond is illustrated in FIG. 1B. In this prior art example, a substrate 120 has a metal line 115 embedded. The metal line could be aluminum or copper. A metal pad 114, often composed of aluminum (Al) is formed over the metal line 115, supported by a dielectric 110. Typically, the aluminum pad will have an oxide layer 112 which forms readily over the surface because of the reactivity of aluminum. A wire 118, often gold (Au), will be bonded to the pad using techniques known in the art, such as thermosonic bonding. One problem in forming wire bonds between gold and aluminum is that gold forms intermetallics with aluminum that can reduce the reliability of the bond.

Another problem with current integrated circuits, particularly those using Cu metallization, is that the low-k dielectrics employed are soft and sensitive to damage by pressure. Circuit testing is performed by pushing a set of test probes against critical conductive points on the top layer. The surface oxide must be broken through (often by a technique known as "scrubbing") in order to form a good contact between the test probe and the pad metal. Therefore, particularly in the case of soft low-k dielectrics, the chip is subjected to potential mechanical damage. It would therefore be desirable to form an I/O pad that does not require scrubbing to provide low contact resistance with test probes.

Solder bump technology (known as flip chip technology in the art) potentially provides higher density and higher performance, but suffers from greater difficulty compared to wire bonding for rework and testing. An example of solder bump technology is controlled-collapse chip connection (C4) in which solder bumps are provided on both the chip and the interconnection substrate, and the connection is made by aligning the solder bumps of the chip and substrate and reflowing the solder to make the connections. The solder bumps are formed by depositing solder on a ball-limiting metallurgy (BLM) as illustrated in FIG. 1A. A metal feature 15, which could be aluminum or copper, is formed in a substrate 16. To prevent the solder from diffusing into the metal feature 15, a multi-layer film of metal 10 is formed as a cap over the metal feature, and then the solder is formed onto the top of the multi-layer cap 10 which may initially extend beyond the cap onto the oxide surface. The ball-limiting metallurgy 10 is formed using multiple layers of metals, such as layer 11 including chromium, layer 12 including copper, and layer 13 including gold. The solder ball 18 is formed by initially depositing solder (a typical solder is 95% lead and 5% tin), using a process such as evaporation through a mask, which overlays the pad and a portion of the surface of the substrate 16. The solder used for attaching flip chips to interconnection substrates has a relatively high melting point so that when the module containing the flip chip is assembled in subsequent packaging, other lower-melting point solders may be flowed without remelting of the flip chip solder connections. The ball 18 is then formed by heating the solder, which reflows into a ball, limited by the dimension of the BLM because of surface tension.

In view of the foregoing discussion, there is a need to provide an I/O site that can take advantage of copper metallization without degrading performance, reduce process steps and increase flexibility in preparing I/O sites.

SUMMARY OF THE INVENTION

The present invention addresses the above-described need by providing a process for fabricating a ball-limiting metallurgy (BLM) that can be used as a common site for both wire bond and controlled-collapse chip connection (C4) wafers.

This invention solves the problem of contamination of the metal lines by providing a diffusion barrier layer between the line and the I/O pad, and by providing a first recessed layer of metal within a feature formed in within a substrate upon which the I/O site of the present invention is formed.

This invention also solves the problem of damage to the chip caused by the forces of probing and/or wire bonding by providing a top layer of noble metal on the I/O site, which eliminates the presence of an oxide layer and requires less bonding force, and, in the case of gold wire bonding, no intermetallics are formed.

This invention has the advantage of reducing the number of process steps used to form an I/O site, and provides a flexible site that can be a common site for either a wire bond or a BLM, thereby reducing overall processing costs.

In accordance with one aspect of the invention, an input-output structure in a feature formed in a substrate, the substrate having a top surface, the feature having feature sidewalls and a feature bottom, the feature bottom formed over an electrically conductive material, the structure comprising:

a barrier layer covering the feature sidewalls and feature bottom, the barrier layer having a barrier bottom and barrier sidewalls;

a seed layer of metal having a seed bottom and seed sidewalls covering at least said barrier bottom; and a first metal layer covering at least said seed bottom and having a recess formed therein, so that a top surface of said first metal layer is lower than the top surface of the substrate; and a second metal layer covering said first metal layer.

In accordance with another aspect of the present invention, an input-output site is formed in a feature in a substrate, the substrate having a top surface, the feature having feature sidewalls and a feature bottom, the feature bottom formed over an electrically conductive material, the method comprising the steps of:

depositing a barrier layer covering the top surface of the substrate, the feature sidewalls and the feature bottom, so that the barrier layer has a barrier bottom and barrier sidewalls;

depositing a seed layer of metal covering the surface of said barrier layer;

selectively removing said seed layer from at least the top surface so that the seed layer is reduced to a portion of the seed layer on at least said barrier bottom;

electroplating a first metal layer using said portion of said seed layer, so that said first metal layer has a recess formed therein and so that a top surface of said first metal layer is lower than the top surface of the substrate; and electroplating a second metal layer, so that said second metal layer covers said first metal layer.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF THE PREFERRED EMBODIMENTS

In the following descriptions of the preferred embodiments of the invention, steps in the formation of the last level build to form a common ball-limiting metallurgy (BLM) structure prior to packaging will be detailed. It will be appreciated that this is intended as an example only, and that the invention may be practiced with a variety of substrates and metals.

Figure 1A:
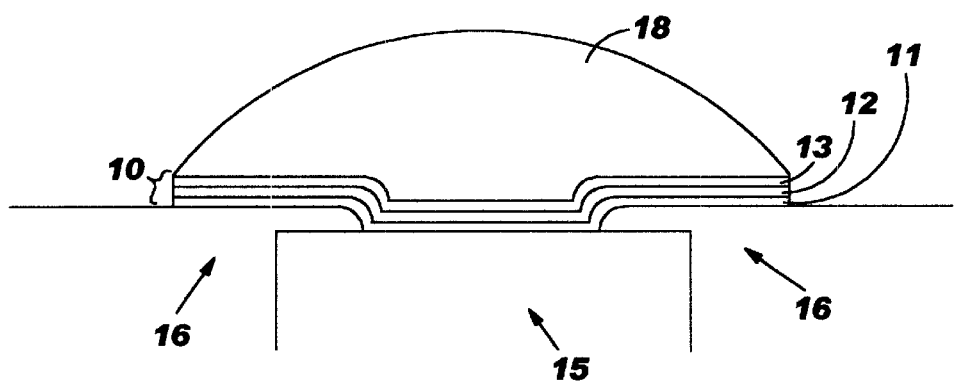
FIG. 1A illustrates a prior art BLM for a C4 site.
Figure 1B:
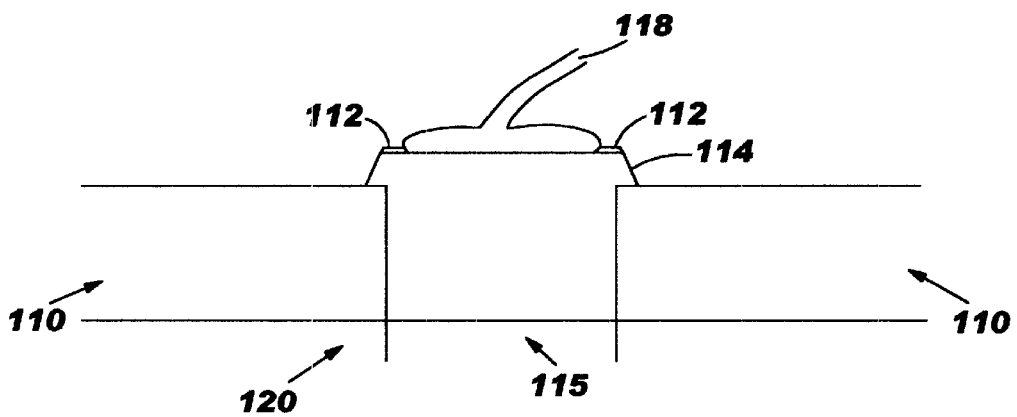
FIG. 1B illustrates a prior art wire bond site.
Figure 2A:
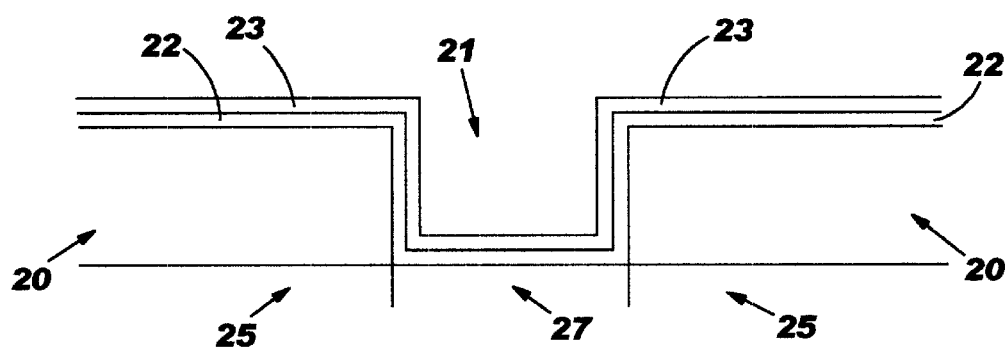
FIG. 2A illustrates the starting structure for the present invention at the last level build prior to packaging, showing the top level conductive layer overlain by a dielectric substrate having a bucket feature, a barrier layer, and a seed layer.

As shown in FIG. 2A, a dielectric layer 20 has a feature 21 formed therein, at the desired location of a metal pad. The dielectric layer 20 is comprised of at least one dielectric material, but is preferably comprised of a stack of dielectric layers such as silicon nitride (SiNx) and silicon dioxide (SiO2). The feature 21 is formed over a conductive feature 27, typically a metal such as aluminum (Al) or copper (Cu), formed in a dielectric substrate 25. In the case of conductive feature 27 formed using Cu, the substrate 25 is preferably a low-k dielectric. A layer 22 of liner material may be deposited on the entire surface of the substrate 20, including the sidewalls and bottom of feature 21. The liner 22 serves as a diffusion barrier and an adhesion promoter. In addition, the liner 22 in accordance with the present invention is electrically conductive. In the case where Cu is to be plated, this liner material is preferably a combination of tantalum (Ta) and tantalum nitride (TaN), preferably with TaN in contact with the dielectric layer 20 and the top surface of the conductive feature 27. A seed layer 23 of metal is deposited over the surface of the liner/barrier layer 22, using deposition methods known in the art, such as by chemical vapor deposition (CVD), or preferably by physical vapor deposition (PVD). The seed layer 23 is typically thin, for example, on the order of about 1000 Å. The seed layer is preferably Cu, which has good adhesion to TaN/Ta.

Figure 2B:
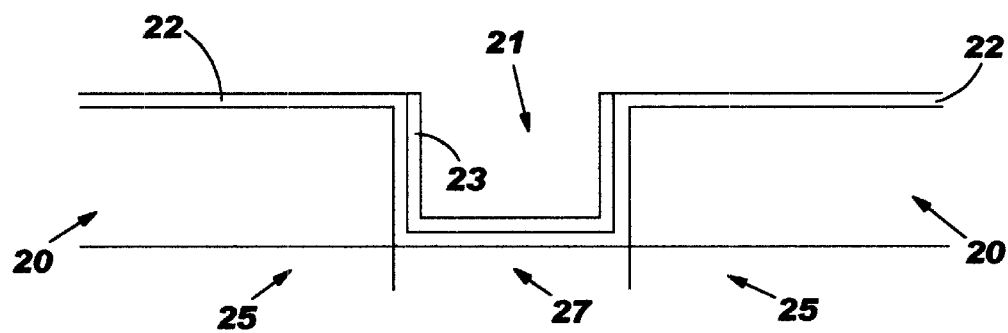
FIG. 2B illustrates the structure following removal of the seed layer from the top surface of the structure shown FIG. 2A, leaving a portion of the seed layer within the bucket feature.

The seed layer 23 is then selectively removed from at least the top surface of the liner 22, preferably using chemical-mechanical polishing (CMP), leaving a portion of the seed layer 23 on at least the bottom of the feature 21 and typically also remaining on the sidewalls of feature 21, resulting in the structure shown in FIG. 2B. Although the resulting seed layer 23 shown in FIG. 2B is flush with the top surface of the barrier layer 22, seed layer 23 could be partially removed from the sidewalls of the feature 21.

Figure 2C:
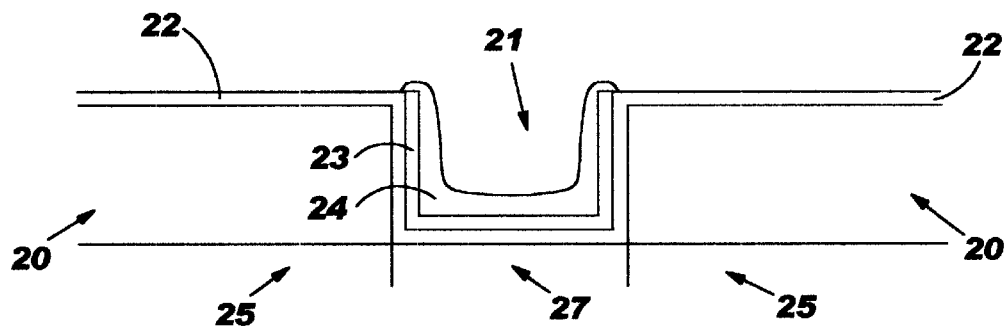
FIG. 2C illustrates the structure following electroplating of a first metal layer onto the structure of FIG. 2B.

A first electroplated layer 24 is formed using the seed layer 23 and applying a current to the barrier layer 22, resulting in the structure illustrated in FIG. 2C. Before layer 24 is formed, the surface of the seed layer 23 must be clean. This can be accomplished by cleaning methods such as brush cleaning, wet cleaning, or wet cleaning with ultrasonics as known in the art. Suitable materials for the first electroplated layer 24 include platinum (Pt), gold (Au), copper (Cu), silver (Ag), solder, or nickel (Ni). In the case where the conductive feature 27 is Cu, the material selected to electroplate layer 24 is preferably selected to act as an additional diffusion barrier, for example Ni. During plating, layer 24 will nucleate only on the seed layer 23 and will not plate on the barrier layer 22.

Figure 2D:
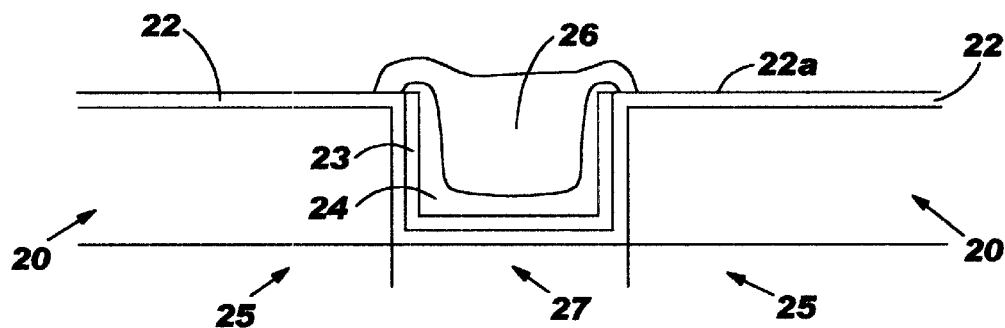
FIG. 2D illustrates the structure following electroplating of a second metal layer onto the structure of FIG. 2C.

A second electroplated layer 26 is formed over the first electroplated layer 24, which will serve as the pad for the common I/O site. Layer 26 is preferably a noble metal, such as Au, platinum, or palladium. Once again, current is applied to the conductive barrier layer 22 during the electroplating process, which is preferably performed while the Ni layer 24 is still wet after the Ni bath has been rinsed. The thickness of layer 26 can be varied according to the desired application, and may extend above the top surface 22a as shown in FIG. 2D, but could be formed to be flush with or recessed below the top surface 22a. Layer 24, preferably Ni, acts as a barrier layer between the seed layer 23, which is preferably Cu, and layer 26, which is preferably Au. The structure illustrated in FIG. 2D in accordance with the present invention is suitable for use as a common I/O site, for example, for either wirebond or C4 sites, which results in cost savings and flexibility. Examples of embodiments of the present invention for wirebond and C4 sites are described below.

First Embodiment: Wirebond Pad

An embodiment of the present invention for use as a wirebond I/O site may be formed starting with the structure in FIG. 2D. The barrier layer 22 is selectively removed from portions of the top surface not covered by plated layer 26, which is preferably Au. This can be performed by a selective polishing method as known in the art, or by a wet etch, such as HF/Nitric acid.

Following the selective removal of the barrier layer 22, an optional scratch protection layer (not shown) may be deposited over the entire surface. A typical scratch protection layer known in the art is polyimide.

Figure 3A:
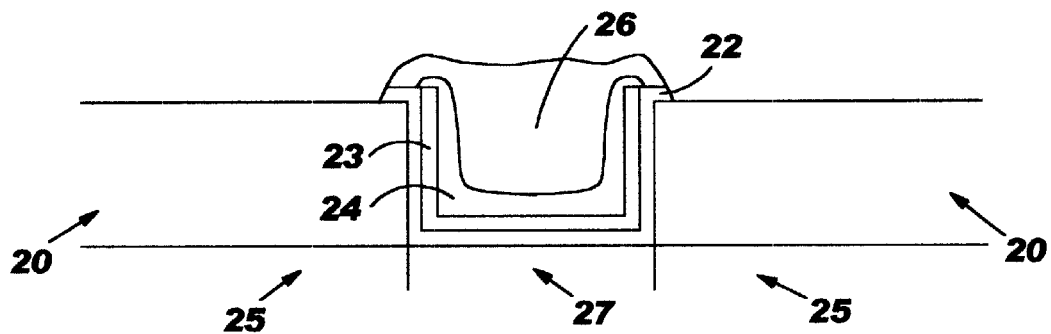
FIG. 3A illustrates the structure following selective removal of the barrier layer from FIG. 2D to form a wirebond site.
Figure 3B:
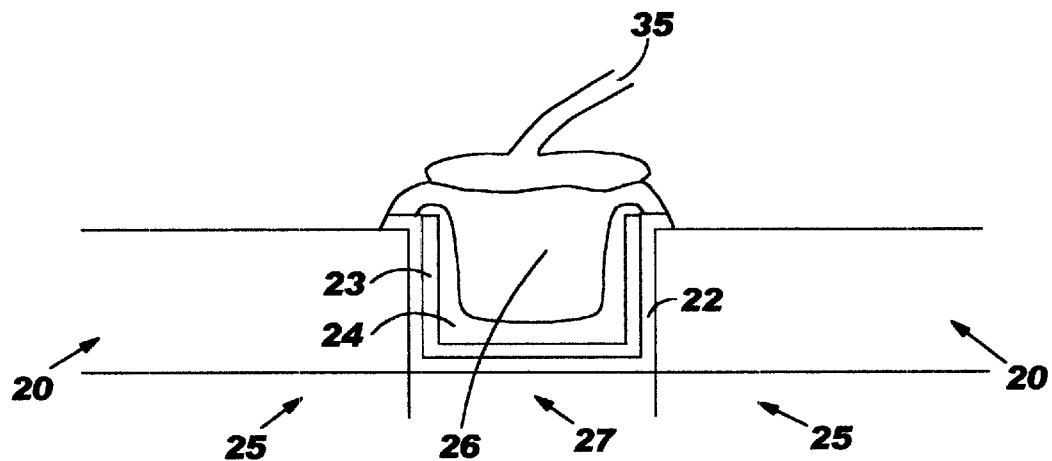
FIG. 3B illustrates the structure after bonding of a wire to the wirebond site of FIG. 3A.

A wire 35, preferably Au, may now be bonded to the pad layer 26 as shown in FIG. 3B. The wire 35, which is also preferably Au, is bonded to the pad 26 using standard techniques known in the art, such as thermosonic bonding, ultrasonic bonding, or thermocompression bonding. The pad layer 26 formed in accordance with the present invention has the advantage over prior art in that lower force is required to provide a bond, since both the wire 35 and the pad 26 may be Au. During the testing of integrated circuits, prior art aluminum pads require a sufficiently large surface so that a test probe can scrub the surface of the pad in order to break through the aluminum oxide layer that normally forms on the surface of the aluminum. Unlike prior art aluminum pads, the pad 26 formed from Au in accordance with the present invention will have a surface that is free of oxide because gold is a noble metal. Because scrubbing during testing is not required, the wirebond pad 26 formed in accordance with the present invention can be smaller than prior art pads, which can result in an increased density of I/O sites.

Second Embodiment: C4 Site with Plated Solder

The structure of FIG. 2D can also be used as the starting structure for an embodiment of the present invention for use as a C4 site in which the solder bump is formed by plating.

Figure 4A:
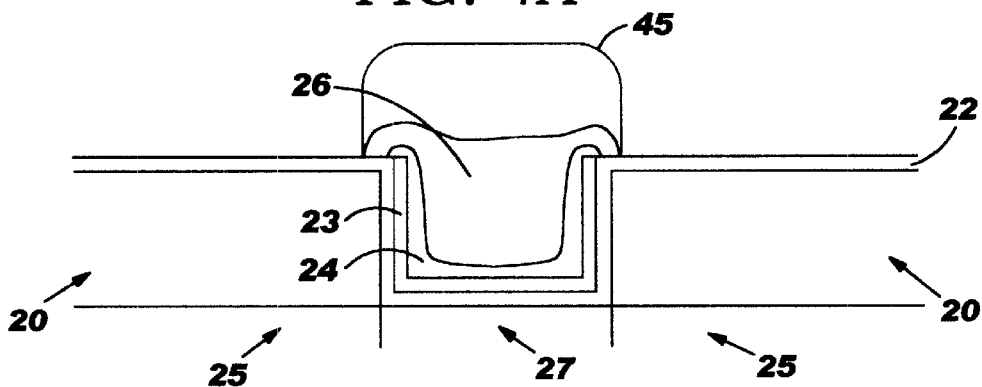
FIG. 4A illustrates the structure following the step of plating solder upon the structure of FIG. 2D.

In this embodiment, a third layer 45 is electroplated onto layer 26 by applying current to the conductive barrier layer 22 as shown in FIG. 4A. Again, the barrier layer 22 is preferably a combination of Ta and TaN. The material used to form layer 45 is a solder, preferably 97% lead (Pb) and 3% tin (Sn), but many other suitable varieties of solder may be used as known in the art.

Figure 4B:
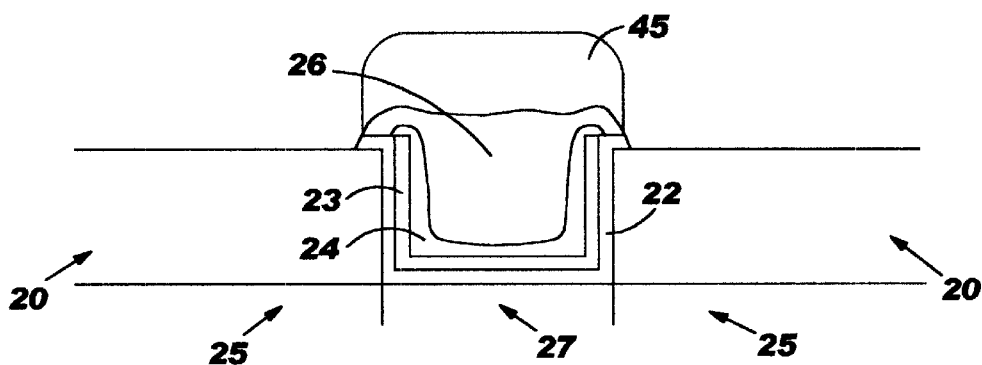
FIG. 4B illustrates the structure following selective removal of the barrier layer from the structure of FIG. 4A.

Next, the conductive barrier layer 22 is selectively removed, preferably by a wet etch technique as known in the art, leaving the solder layer 45 as shown in FIG. 4B.

Figure 4C:
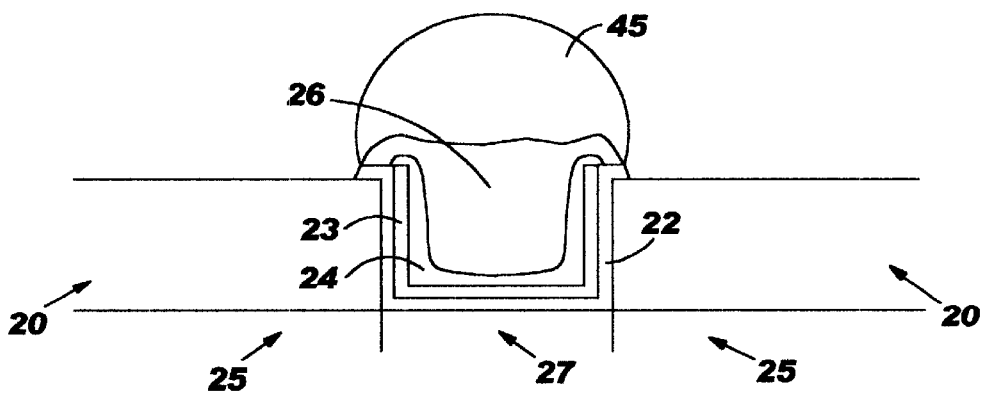
FIG. 4C illustrates the C4 structure following reflow of the plated solder in FIG. 4B.

Finally, the solder is re-flowed to form the C4 solder bump 45 as shown in FIG. 4C, using standard techniques as known in the art.

Third Embodiment: C4 Site with Evaporated Solder

Figure 5A:
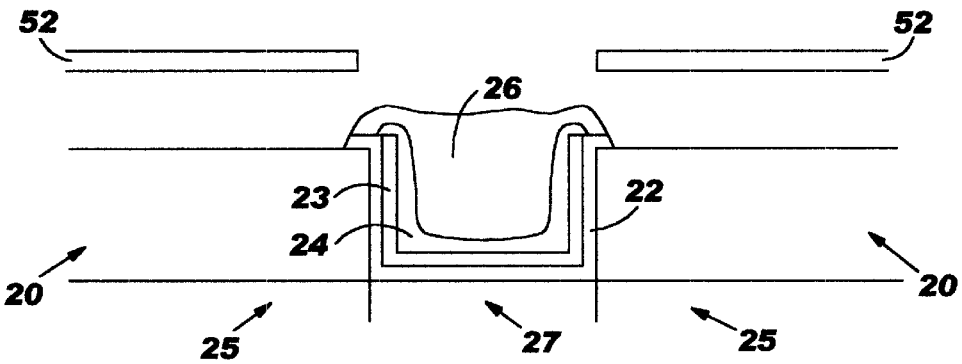
FIG. 5A illustrates the step of evaporating solder using a mask onto the structure of FIG. 3A.

As an alternative embodiment of the present invention, a C4 solder bump may be formed starting with the structure of FIG. 3A in which the barrier layer 22 of FIG. 2D has been selectively removed. A mask 52 is held in a fixture over the surface of the substrate as shown in FIG. 5A. The mask material is any suitable material known in the art used for evaporation of solder, and is preferably molybdenum (Mo). The evaporation of a solder is well-known in the art, and any suitable solder may be used, but is preferably a mixture of 97% Pb and 3% Sn.

Figure 5B:
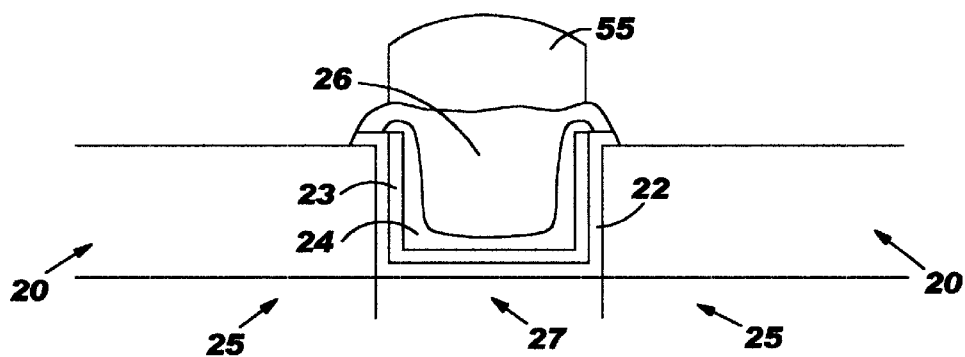
FIG. 5B illustrates the structure following evaporation of solder as illustrated in FIG. 5A.

After evaporation, the mask 52 is removed, leaving evaporated layers 55 of Pb and Sn on the pad layer 26 as shown in FIG. 5B.

Figure 5C:
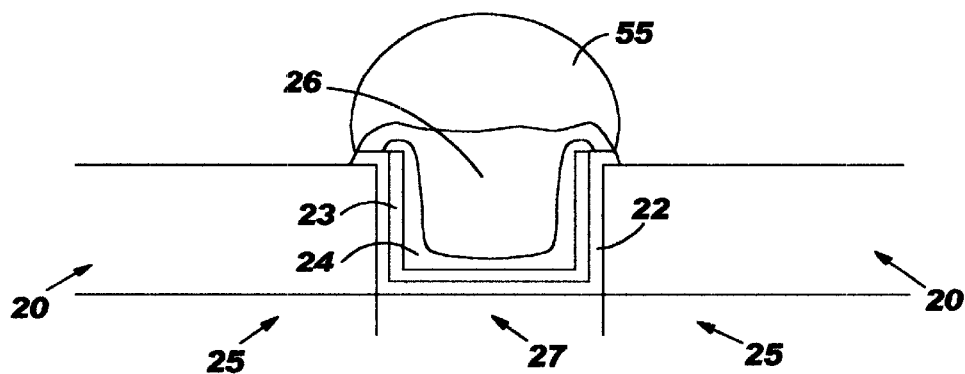
FIG. 5C illustrates the C4 structure following reflow of the evaporated solder from FIG. 5B.

Next, the solder is reflowed to form the C4 solder bump 55 shown in FIG. 5C.

In summary, the common BLM structures formed in accordance with the present invention allows the use of noble metals to form I/O pads that reduce costs by simplifying process-steps and also allow an increase in I/O site density due to smaller pad sizes.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. An input-output structure in a feature formed in a substrate, the substrate having a top surface, the feature having feature sidewalls and a feature bottom, the feature bottom formed over and in contact with an electrically conductive material, the structure comprising:

a barrier layer covering the feature sidewalls and feature bottom, the barrier layer having a barrier bottom and barrier sidewalls;

a seed layer of metal having a seed bottom and seed sidewalls covering at least said barrier bottom, said seed layer not extending above said barrier sidewalls;

a first metal layer completely covering remaining surfaces of said seed layer, so that said seed layer is completely enclosed by said barrier layer and by said first metal layer, and wherein said first metal layer has a recess formed therein, so that a top surface of said first metal layer is lower than the top surface of the substrate, wherein said first metal layer comprises an electroplatable material selected from the group consisting of copper, platinum, nickel, gold, silver and solder; and a second metal layer covering said first metal layer, said second metal layer consisting essentially of a noble metal.

2. The input-output structure of claim 1 wherein the noble metal is selected from the group consisting of gold, platinum, and palladium.

3. The input-output structure of claim 1 wherein the noble metal is gold.

4. The input-output structure of claim 1 wherein said seed layer comprises copper.

5. The input-output structure of claim 1 wherein said first metal layer comprises nickel.

6. The input-output structure of claim 1 wherein said barrier layer comprises tantalum and tantalum nitride.

7. The input-output structure of claim 6 wherein the tantalum nitride is in contact with the substrate.

8. The input-output structure of claim 1 further comprising a wire bonded to said second metal layer.

9. The input-output structure of claim 8 wherein said wire comprises gold and the noble metal is gold.

10. The input-output structure of claim 1 further comprising a solder ball connected to said second metal layer.

11. The input-output structure of claim 1 wherein said first metal layer consists essentially of nickel, and the noble metal is gold.

12. The input-output structure of claim 11 wherein the electrically conductive material comprises copper.

13. The input-output structure of claim 1 wherein said seed layer consists essentially of copper, said first metal layer consists essentially of nickel, and the noble metal is gold.

14. The input-output structure of claim 13 wherein the electrically conductive material comprises copper.

15. The input-output structure of claim 1 wherein said barrier layer completely covers said feature sidewalls.

16. The input-output structure of claim 1 wherein said barrier layer is arranged so that said first and second metal layers do not directly contact the substrate.

17. The input-output structure of claim 1 wherein said first metal layer consists essentially of an electroplatable material.

* * * * *